United States Patent
Kim et al.

(10) Patent No.: US 12,272,798 B2
(45) Date of Patent: Apr. 8, 2025

(54) BATTERY MODULE FOR DETECTING HIGH TEMPERATURE OF BATTERY CELL

(71) Applicant: LG CHEM, LTD., Seoul (KR)

(72) Inventors: Kyung Jik Kim, Daejeon (KR); Jin Hyun Lee, Daejeon (KR); Young Su Son, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 499 days.

(21) Appl. No.: 17/294,735

(22) PCT Filed: Jan. 31, 2020

(86) PCT No.: PCT/KR2020/001539
§ 371 (c)(1),
(2) Date: May 18, 2021

(87) PCT Pub. No.: WO2020/166861
PCT Pub. Date: Aug. 20, 2020

(65) Prior Publication Data
US 2022/0021035 A1   Jan. 20, 2022

(30) Foreign Application Priority Data
Feb. 13, 2019   (KR) .................. 10-2019-0016783

(51) Int. Cl.
| | |
|---|---|
| H01M 10/44 | (2006.01) |
| G01K 1/02 | (2021.01) |
| G01K 3/00 | (2006.01) |
| G01K 7/22 | (2006.01) |
| G01R 31/3835 | (2019.01) |
| G01R 31/396 | (2019.01) |
| H01M 10/42 | (2006.01) |
| H01M 10/48 | (2006.01) |
| H02J 7/00 | (2006.01) |

(52) U.S. Cl.
CPC ........ H01M 10/4257 (2013.01); G01K 1/026 (2013.01); G01K 3/005 (2013.01);
(Continued)

(58) Field of Classification Search
CPC .......... H01M 10/4257; H01M 10/441; H01M 10/486; H01M 2200/106; G01R 31/3835; G01R 31/396; G01K 3/005; H02J 7/00309
See application file for complete search history.

(56) References Cited

U.S. PATENT DOCUMENTS

| | | | |
|---|---|---|---|
| 11,050,096 B2 * | 6/2021 | Kim ................... | G01R 31/382 |
| 2003/0157399 A1 | 8/2003 | Ikeuchi et al. | |

(Continued)

FOREIGN PATENT DOCUMENTS

| | | |
|---|---|---|
| CN | 105210256 A | 12/2015 |
| JP | 2001-91363 A | 4/2001 |

(Continued)

OTHER PUBLICATIONS

International Search Report issued in PCT/KR2020/001539 (PCT/ISA/210), dated May 8, 2020.
(Continued)

*Primary Examiner* — Julian D Huffman
*Assistant Examiner* — Sadia Kousar
(74) *Attorney, Agent, or Firm* — Birch, Stewart, Kolasch & Birch, LLP

(57) ABSTRACT

A battery module according to an embodiment of the present invention is composed of a plurality of battery cells. The battery module includes one positive (+) output terminal formed by connecting the plurality of battery cells, a field effect transistor (FET) provided on a current path between the positive (+) output terminal and an external device to block charging or discharging of a battery module, a protection integrated circuit (IC) chip for controlling the FET, and a high temperature detector for detecting whether the battery module is above a predetermined temperature and
(Continued)

including a plurality of positive temperature coefficient (PTC) thermistors connected in series with each other.

11 Claims, 3 Drawing Sheets

(52) U.S. Cl.
CPC ........... *G01K 7/22* (2013.01); *G01R 31/3835* (2019.01); *G01R 31/396* (2019.01); *H01M 10/441* (2013.01); *H01M 10/48* (2013.01); *H01M 10/482* (2013.01); *H01M 10/486* (2013.01); *H02J 7/0013* (2013.01); *H02J 7/00309* (2020.01); *H02J 7/0047* (2013.01); *H01M 2010/4271* (2013.01); *H01M 2200/106* (2013.01)

(56) References Cited

U.S. PATENT DOCUMENTS

| | | | |
|---|---|---|---|
| 2007/0273328 | A1 | 11/2007 | Nam et al. |
| 2009/0085519 | A1 | 4/2009 | Kim |
| 2011/0210703 | A1* | 9/2011 | Souza .............. H01M 50/581 320/136 |
| 2019/0288355 | A1 | 9/2019 | An et al. |

FOREIGN PATENT DOCUMENTS

| | | |
|---|---|---|
| JP | 2002-75465 A | 3/2002 |
| JP | 2002-75469 A | 3/2002 |
| JP | 3831589 B2 | 10/2006 |
| JP | 2008-251472 A | 10/2008 |
| JP | 2010-122088 A | 6/2010 |
| JP | 2011-151904 A | 8/2011 |
| JP | 2012-68116 A | 4/2012 |
| KR | 10-2006-0064829 A | 6/2006 |
| KR | 10-2009-0032273 A | 4/2009 |
| KR | 10-2010-0133560 A | 12/2010 |
| KR | 10-2013-0075374 A | 7/2013 |
| KR | 10-1344251 B1 | 12/2013 |
| KR | 10-2016-0061721 A | 6/2016 |
| KR | 10-1628850 B1 | 6/2016 |
| KR | 10-2018-0029602 A | 3/2018 |
| KR | 10-1861179 B1 | 5/2018 |

OTHER PUBLICATIONS

European Search Report for European Patent Application No. 20756305.7 dated Feb. 4, 2022.

* cited by examiner

BATTERY MODULE FOR DETECTING HIGH TEMPERATURE OF BATTERY CELL

TECHNICAL FIELD

The present invention relates to a battery module that detects a high temperature of a battery gel and blocks the output when a high temperature is detected.

More specifically, the present invention relates to a battery module that includes a PTC element and a heat insulating film in each battery cell, detect a high temperature of the battery cell using only one port of a protection IC chip, and blocking an output when a high temperature is detected.

BACKGROUND ART

A general battery module is composed of a plurality of battery cells that can be charged/discharged.

In particular, when a Li-ion battery cell is used for a long time, heat is generated in the battery cell, and in particular, a large-capacity battery module composed of a plurality of battery cells may generate more heat as the amount of current increases during charging or discharging.

As such, when the internal temperature of the battery module rises, a problem may occur in the stability of the battery module.

Therefore, when the temperature of the battery module rises above a predetermined value, charging or discharging of the battery module should be blocked.

For this, conventionally, a temperature sensor is provided in each battery cell, and a temperature sensor provided in each battery cell transmits temperature information to a protection IC chip, so that the protection IC chip blocks charging or discharging of the battery module based on the received temperature.

However, in the related art, since the temperature sensor provided in each of the battery cells transmits the battery cell temperature value to the protection IC chip, there is a problem in that the protection IC chip requires many ports for temperature reception.

In addition, in the prior art, each of the battery cells is provided with a temperature sensor, but only the battery cell temperature of the portion where the temperature sensor is located is measured and transmitted to the protection IC chip, and therefore, there is a problem in detecting heat generation occurring in a portion far from the temperature sensor in the battery cell.

Meanwhile, in some cases, even if a high temperature is detected in only one of the cells without having to check which of the battery cells is at a high temperature, it may be desirable to block charging or discharging of the battery module for stability of the battery module.

Therefore, in the present invention to solve the problems of the prior art, although which of the battery cells detects a high temperature cannot be known, it is proposed to detect the high temperature of the battery cell by using one port of the protection IC chip, and block charging or discharging of the battery module by measuring the overall temperature of each battery cell.

(Prior art document) Korea Patent Publication KR 1628850 B1

DISCLOSURE OF THE INVENTION

Technical Problem

The present invention provides a battery module that blocks charging or discharging by detecting a high temperature of a battery cell using only one port of a protection IC chip.

In addition, the present invention provides a battery module for measuring the overall temperature of each battery cell.

Technical Solution

A battery module according to an embodiment of the present invention is composed of a plurality of battery cells. The battery module includes one positive (+) output terminal connected to the plurality of battery cells, a field effect transistor (FET) provided on a current path between the positive (+) output terminal and an external device to block charging or discharging of the battery module, a protection integrated circuit (IC) chip configured to control the FET, and a high temperature detector configured to detect whether a temperature of the battery module is above a predetermined temperature, a first end of the high temperature detector is connected to the positive (+) output terminal, a second end of the high temperature detector is connected to one input port of the protection IC chip and the high temperature detector includes a plurality of positive temperature coefficient (PTC) thermistors connected in series with each other.

Each of the plurality of PTC thermistors may include a temperature-sensitive dielectric constant changing unit in which a dielectric constant decreases when exposed to at least a predetermined threshold temperature, and the temperature-sensitive dielectric constant changing unit of each of the plurality of PTC thermistors may directly contact a surface of a respective battery cell among the plurality of battery cells.

The protection IC chip may be configured to determine whether at least one battery cell of the plurality of battery cells has a temperature above the predetermined temperature when a voltage applied to the one input port of the protection IC chip connected to the second end of the high temperature detector is lowered, and turn off the FET to block charging or discharging of the battery module.

Meanwhile, a plurality of battery modules according to an embodiment of the present invention may be connected to be implemented as one battery pack.

Meanwhile, a battery module according to an embodiment of the present disclosure may be mounted in various electronic devices.

A battery module according to another embodiment of the present invention is composed of a plurality of battery cells. The battery module includes one positive (+) output terminal connected to the plurality of battery cells, a field effect transistor (FET) provided on a current path between the positive (+) output terminal and an external device, a protection integrated circuit (IC) chip configured to control the FET, a plurality of thermal film films, each thermal film surrounding a respective one of the battery cells, and a high temperature detector configured to detect whether a temperature of the battery module is above a predetermined temperature, a first end of the high temperature detector is connected to the positive (+) output terminal, a second end of the high temperature detector is connected to one input port of the protection IC chip and the high temperature detector includes a plurality of positive temperature coefficient (PTC) thermistors connected in series with each other.

Each of the plurality of PTC thermistors may include a temperature-sensitive dielectric constant changing unit in which a dielectric constant decreases when exposed to at least a predetermined threshold temperature or more, and the temperature-sensitive dielectric constant changing unit of each of the plurality of PTC thermistors may contact a respective one of the thermal films.

The protection IC chip may be configured to determine whether at least one battery cell of the plurality of battery cells has a temperature above the predetermined temperature when a voltage applied to the one input port of the protection IC chip connected to the second end of the high temperature detector is lowered, and turn off the FET to block charging or discharging of the battery module.

Meanwhile, a plurality of battery modules according to another embodiment of the present invention may be connected to be implemented as one battery pack.

Meanwhile, a battery module according to another embodiment of the present disclosure may be mounted in various electronic devices.

A method for detecting a high temperature of a battery cell in a battery module composed of a plurality of battery cells according to another embodiment of the present invention includes a voltage measurement step of measuring a voltage applied to one input port of a protection IC chip, a high temperature determination step of determining whether any one of the plurality of battery cells has a temperature above a predetermined temperature, and a charging or discharging blocking step of blocking charging or discharging of the battery module when it is determined that the temperature of at least one battery cell among the plurality of battery cells is above the predetermined temperature in the high temperature determination step. The voltage applied to the one input port of the protection IC chip varies by a plurality of positive temperature coefficient (PTC) thermistors provided in contact with each of the plurality of battery cells, the plurality of PTC thermistors are connected in series with each other.

The high temperature determination step may include determining that all battery cells have a temperature less than the predetermined temperature when the voltage applied to the one input port of the protection IC chip is less than a predetermined reference voltage, and determining that the temperature of at least one battery cell among the plurality of battery cells is above the predetermined temperature when the voltage applied to the one input port of the protection IC chip is greater than or equal to the predetermined reference voltage.

Advantageous Effects

The present invention can detect the high temperature of the battery cell using only one port of the protection IC chip to block charging or discharging.

In addition, the present invention can measure the overall temperature of each battery cell.

MODE FOR CARRYING OUT THE INVENTION

Figure 1:
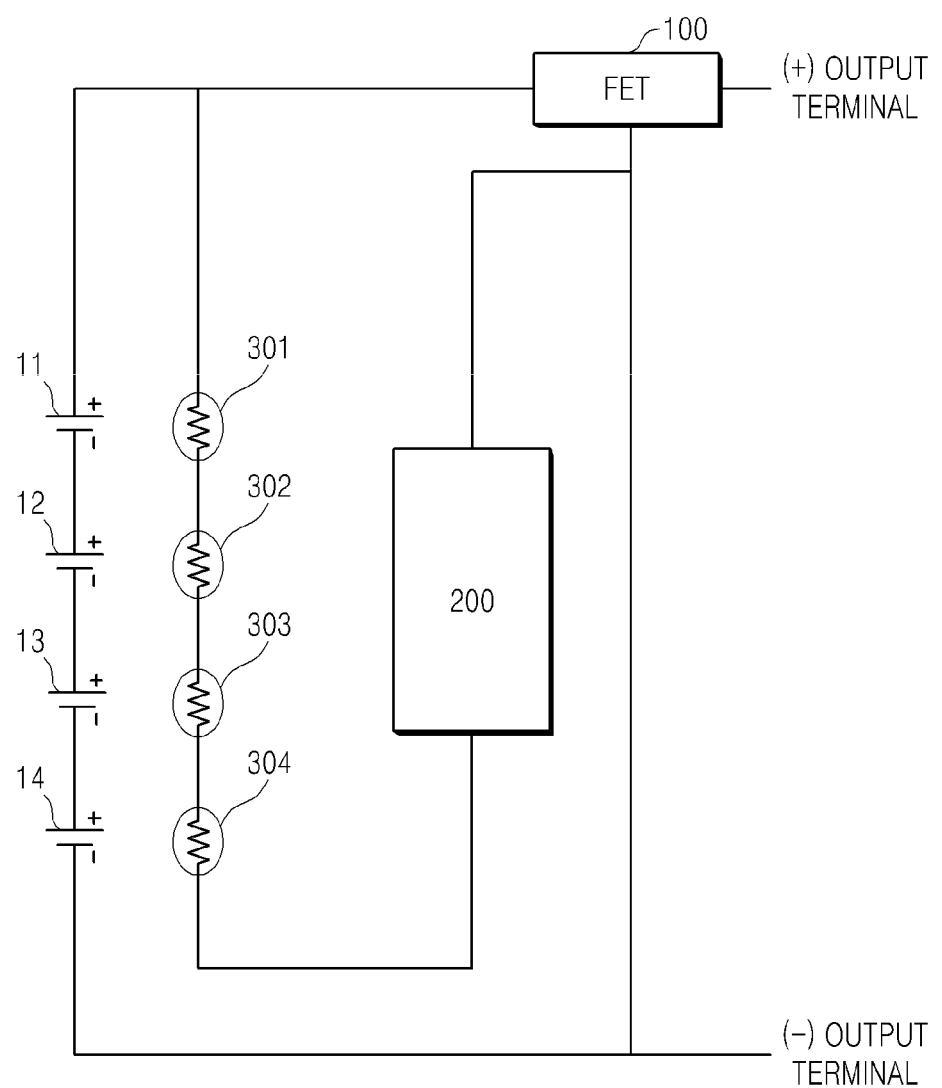
FIG. 1 is a view showing a battery module according to an embodiment of the present invention.

Hereinafter, embodiments of the present invention will be described in detail with reference to the accompanying drawings so that those skilled in the art may easily carry out the present invention. The present invention may, however, be embodied in different forms and should not be construed as limited to the embodiments set forth herein. Parts not relating to description are omitted in the drawings in order to clearly describe the present invention and like reference numerals refer to like elements throughout.

Although the terms "initial," "second," etc., may be used herein to describe various elements, these elements should not be limited by these terms. The above terms are used only to distinguish one component from another. For example, an initial component may be referred to as a second component and vice versa without departing from the scope of the present invention. Terms used in this specification are used to describe specific embodiments, and are not intended to limit the scope of the present invention. The singular expressions include plural expressions unless the context clearly dictates otherwise.

Throughout the specification, when a portion is referred to as being "connected" to another portion, it includes not only "directly connected" but also "electrically connected" with another element therebetween. Furthermore, when it is described that one comprises (or includes or has) some elements, it should be understood that it may comprise (or include or has) only those elements, or it may comprise (or include or have) other elements as well as those elements if there is no specific limitation. The term "~ing operation" or "operation of ~ing" used throughout the specification does not mean "operation for ~ing".

Terms used in this specification may be currently widely used general terms in consideration of functions in the present invention but may vary according to the intents of those skilled in the art, precedents, or the advent of new technology. Additionally, in certain cases, there may be terms the applicant selects arbitrarily and in this case, their meanings are described in a corresponding description part of the present invention. Accordingly, terms used in the present invention should be defined based on the meaning of the term and the entire contents of the present invention instead of the simple term name.

1. Battery Module According to an Embodiment of the Present Invention

FIG. 1 is a view showing the configuration of a battery module according to an embodiment of the present invention.

Hereinafter, a battery module according to an embodiment of the present invention will be described with reference to FIG. 1.

A battery module according to an embodiment of the present invention is composed of a plurality of battery cells, and the battery module may be configured to include one (+) output terminal formed by connecting the plurality of battery cells, a FET 100 provided on a current path between the (+) output terminal and an external device; a protection IC chip 200 for controlling the FET 100, and a high temperature detection unit for detecting whether the battery module is at a high temperature.

Specifically, in relation to the high temperature detection unit, one end may be connected to the (+) output terminal, and the other end may be connected to one input boat of the protection IC chip.

Meanwhile, the high temperature detection unit may include a plurality of PTC thermistors connected in series with each other.

Meanwhile, the number of PTC thermistors may be equal to the number of battery cells constituting the battery module.

On the other hand, each of the plurality of PTC thermistors is configured to include a temperature-sensitive dielectric constant changing unit in which the dielectric constant decreases when there is a predetermined threshold temperature or more, and the temperature-sensitive dielectric constant change unit may be provided to directly contact a surface of each of the plurality of battery cells.

For example, when the first to fourth battery cells 11 to 14 form one module as shown in FIG. 1, the high temperature detection unit includes first to fourth PTC thermistors 301 to 304, and the first to fourth PTC thermistors 301 to 304 are provided on the surface of each of the first to fourth battery cells 11 to 14, and the first to fourth PTC thermistors 301 to 304 may be connected in series with each other.

In other words, the first PTC thermistor 301 is provided on the surface of the first battery cell 11, and one end is connected to the (+) output terminal, and the other end is connected to one end of the second PTC thermistor 302. The second PTC thermistor 302 may be provided on the surface of the second battery cell 12, and the other end may be connected to one end of the third PTC thermistor 303.

Meanwhile, in relation to the third PTC thermistor 303, one end is connected to the other end of the second PTC thermistor 302, and the other end is connected to one end of the fourth PTC thermistor 304. One end of the fourth PTC thermistor 304 may be connected to the other end of the third PTC thermistor 303, and the other end may be connected to a predetermined input port of the protection IC chip 200.

As a result, since the protection IC chip 200 detects the high temperature of the battery cell using only one port, the port use efficiency may be higher than that of the conventionally assigned multiple ports for temperature sensing.

Specifically, in relation to a plurality of PTC thermistors provided on the surface of each of the plurality of battery cells and connected in series with each other, when a high temperature occurs in any one of the plurality of battery cells, the resistance of the PTC thermistor provided on the surface of the battery cell where the high temperature is generated rapidly increases so that the resistance of all PTC thermistors connected in series increases. If the resistance of the entire PTC thermistors increases, a lower voltage is applied to a predetermined input port of the protection IC chip when high temperature does not occur, and the protection IC chip detects this and determines that a high temperature occurs in at least one of the battery cells, thereby controlling the FET 100 to block charging or discharging of the battery module.

That is, in the related art, the number of ports can be reduced compared to the protection IC chip receiving temperature information of each battery cell using a plurality of ports (or using a multi-channel AFE).

Meanwhile, a plurality of battery modules according to an embodiment of the present invention may be connected to be implemented as a single battery pack.

Meanwhile, the battery module according to an embodiment of the present invention may be mounted in an electronic device.

For example, the electronic device may be a laptop, a mobile phone, a PDA, a drone, or the like.

2. Battery Module According to Another Embodiment of the Present Invention

Figure 2:
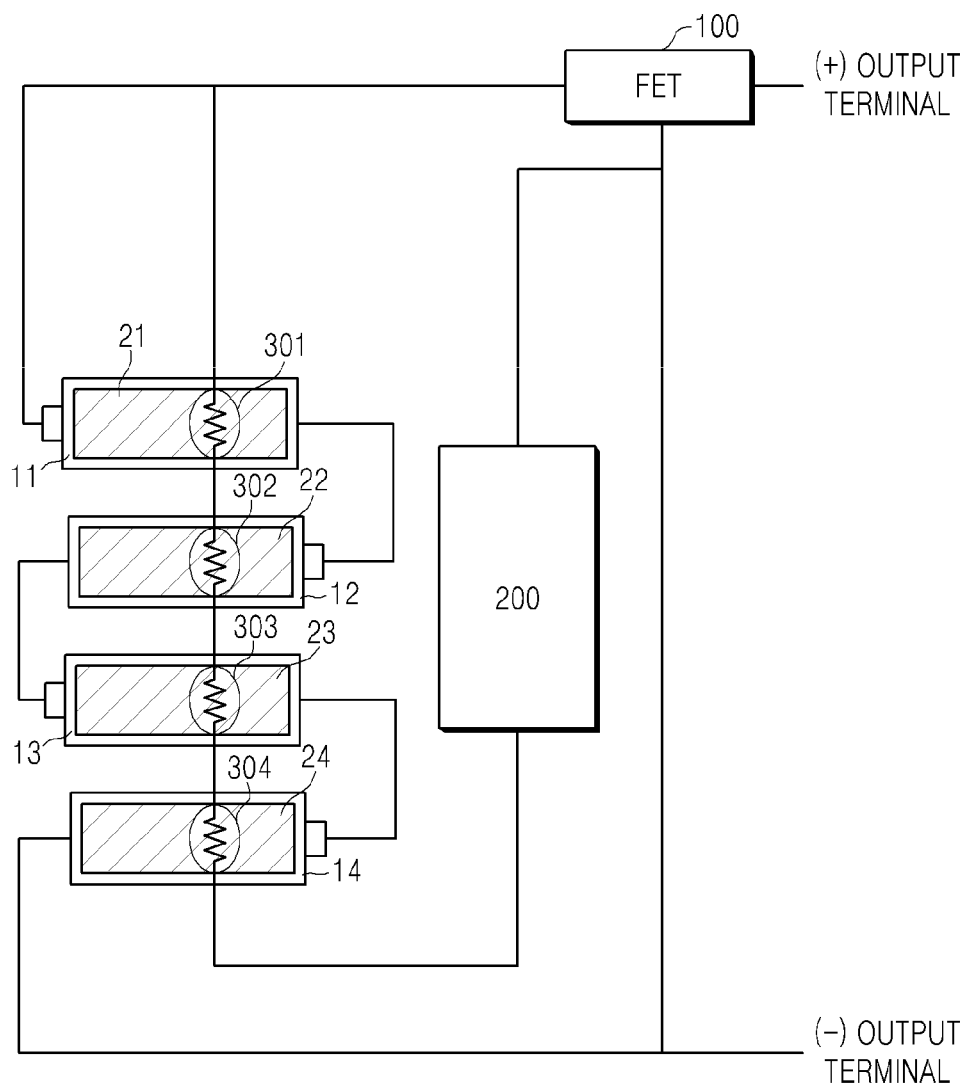
FIG. 2 is a view showing a battery module according to another embodiment of the present invention.

FIG. 2 is a view showing a battery module according to another embodiment of the present invention.

Hereinafter, a battery module according to another embodiment of the present invention will be described with reference to FIG. 2.

The battery module according to another embodiment of the present invention may be composed of a plurality of battery cells. Then, the battery module is composed of a plurality of battery cells, and the battery module may include one (+) output terminal formed by connecting the plurality of battery cells, a FET 100 provided on a current path between the (+) output terminal and an external device; a thermal film for surrounding each of the plurality of battery cells, and a high temperature detection unit for detecting whether the battery module is at a high temperature.

In detail, each of the plurality of battery cells may be surrounded by a thermal film, and may be spaced apart from adjacent battery cells by a predetermined interval. In this case, the predetermined interval spaced apart is a value in which adjacent battery cells are not affected by the temperature of the adjacent battery cells.

Meanwhile, one end of the high temperature detection unit may be connected to the (+) output terminal, and the other end may be connected to one input port of the protection IC chip.

Meanwhile, the high temperature detection unit may include a plurality of PTC thermistors connected in series with each other.

Meanwhile, the number of PTC thermistors may be equal to the number of battery cells.

Meanwhile, each of the plurality of PTC thermistor may be configured to include a temperature-sensitive dielectric constant changing unit in which the dielectric constant decreases when there is a predetermined threshold temperature or more.

The temperature-sensitive dielectric constant changing unit may be provided to directly contact each of the thermal films surrounding each of the plurality of battery cells.

In other words, if the thermal film is wrapped around each battery cell to detect the temperature of the thermal film, the overall temperature of the battery cell may be sensed instead of the temperature of the specific point where the temperature-sensitive dielectric constant changing unit is provided.

For example, when the first to fourth battery cells 11 to 14 form one module as shown in FIG. 1, the high temperature detection unit is configured to include first to fourth PTC thermistors 301 to 304. Each of the first to fourth battery cells 11 to 14 may be configured to include first to fourth thermal films 21 to 24 surrounding each battery cell. The first to fourth PTC thermistors are provided on the first to fourth thermal films 21 to 24, respectively. The first to fourth PTC thermistors 301 to 304 may be connected in series with each other.

In other words, the first PTC thermistor 301 is provided on the first thermal film 21 of the first battery cell 11, and one end is connected to the (+) output terminal, and the other end is connected to one end of the second PTC thermistor 302. The second PTC thermistor 302 may be provided on the second thermal film 22, and the other end may be connected to one end of the third PTC thermistor 303.

Meanwhile, in relation to the third PTC thermistor 303, one end is connected to the other end of the second PTC thermistor 302, and the other end is connected to one end of the fourth PTC thermistor 304. One end of the fourth PTC thermistor 304 may be connected to the other end of the third PTC thermistor 303, and the other end may be connected to a predetermined input port of the protection IC chip 200.

Due to this, the protection IC chip 200 may detect a high temperature of the battery cell using only one port.

Specifically, in relation to the PTC thermistors provided on the thermal film of each of the plurality of battery cells and connected in series with each other, when a high temperature occurs in one of the thermal films of the battery cells, the resistance of the PTC thermistor mounted on the thermal film generated at a high temperature increases rapidly so that the resistance of all PTC thermistors connected in series increases.

When the resistance of the entire PTC thermistor increases, a lower voltage is applied to a predetermined input port of the protection IC chip than when no high temperature occurs. The protection IC chip detects this and determines that a high temperature occurs in at least one of the battery cells, thereby controlling the FET 100 to block charging or discharging of the battery module.

That is, in the related art, the number of ports can be reduced compared to the protection IC chip receiving temperature information of each battery cell using a plurality of ports (or using a multi-channel AFE).

Meanwhile, a plurality of battery modules according to another embodiment of the present invention may be connected to be implemented as a single battery pack.

Meanwhile, the battery module according to another embodiment of the present invention may be mounted in an electronic device.

For example, the electronic device may be a laptop, a mobile phone, a PDA, a drone, or the like.

3. High Temperature Sensing Method of a Battery Cell According to another Embodiment of the Present Invention.

Figure 3:
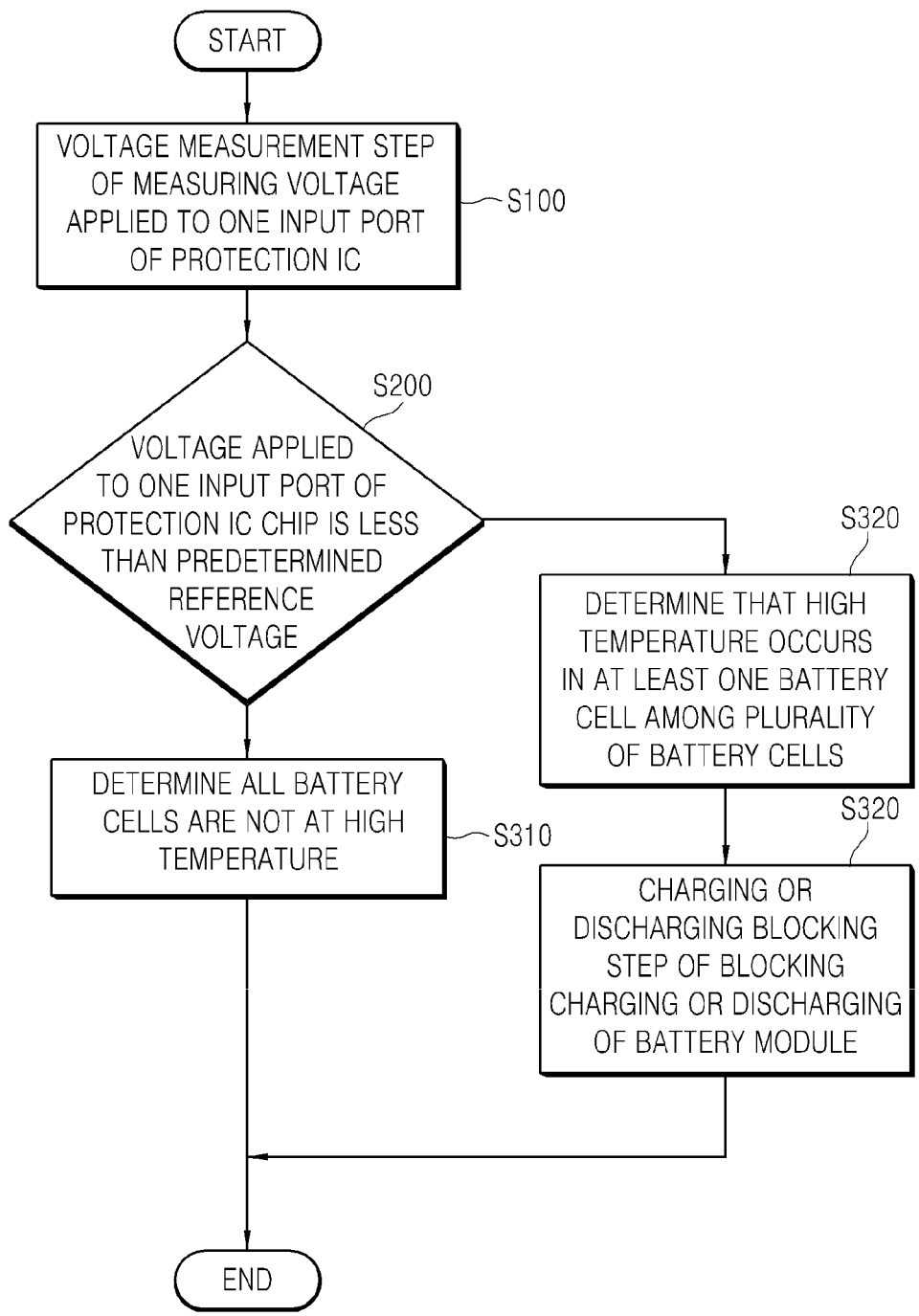
FIG. 3 is a flowchart illustrating a method of detecting a high temperature of a battery cell according to another embodiment of the present invention.

FIG. 3 is a flowchart illustrating a method of detecting a high temperature of a battery cell according to another embodiment of the present invention.

A high temperature detecting method of a battery cell according to another embodiment of the present invention may be configured to include a voltage measurement step (S100) of measuring the voltage applied to one input port of the protection IC chip, a high temperature determination step (S200) of determining whether the battery cell is at a high temperature based on the measured voltage, and a charging or discharging blocking step (S330) of blocking the charging or discharging of the battery module when it is determined that the battery cell is at a high temperature in the high temperature determination step (S200).

Specifically, the voltage applied to one input port of the protection IC chip measured in the voltage measurement step (S100) may vary by a plurality of PTC thermistors provided in contact with each of the plurality of battery cells and connected in series with each other Meanwhile, the high temperature determination step (S200) may determine (S310) that all battery cells are not high temperature if the voltage applied to one input port of the protection IC chip is less than a predetermined reference voltage, and may determine (S320) that a high temperature occurs in at least one battery cell among the plurality of battery cells if the voltage applied to one input port of the protection IC chip is more than a predetermined reference voltage.

On the other hand, although the technical idea of the present invention is specifically described with reference to the above embodiments, it should be noted that the above embodiments are for the purpose of explanation and not for the purpose of limitation. It will be apparent to those skilled in the art that various modifications and variations may be made in the present invention without departing from the spirit and scope of the invention.

The invention claimed is:

1. A battery module composed of a plurality of battery cells, the battery module comprising:
one positive output terminal connected to the plurality of battery cells;
a field effect transistor (FET) provided on a current path between the positive output terminal and an external device to block charging or discharging of the battery module;
a protection integrated circuit (IC) chip configured to control the FET; and
a high temperature detector configured to detect whether a temperature of the battery module is above a predetermined temperature,
wherein a first end of the high temperature detector is connected to the positive output terminal,
wherein a second end of the high temperature detector is connected to one input port of the protection IC chip,
wherein the protection IC chip is configured to detect a high temperature of at least one of the plurality of battery cells using only the one input port of the protection IC chip,
wherein the protection IC chip is configured to control blocking the charging and the discharging of the battery module by using only one output port of the protection IC chip,
wherein the high temperature detector includes a plurality of positive temperature coefficient (PTC) thermistors connected in series with each other,
wherein the protection IC chip only includes two ports, the two ports being the one input port configured to detect the high temperature of the at least one of the plurality of battery cells and the one output port configured to control the blocking the charging and the discharging of the battery module, and
wherein the protection IC chip is not directly connected to any battery cell of the plurality of battery cells.

2. The battery module of claim 1, wherein each of the plurality of PTC thermistors includes a temperature-sensitive dielectric constant changing unit in which a dielectric constant decreases when exposed to at least a predetermined threshold temperature, and
wherein the temperature-sensitive dielectric constant changing unit of each of the plurality of PTC thermistors is provided to directly contact a surface of a respective battery cell among the plurality of battery cells.

3. The battery module of claim 1, wherein the protection IC chip is configured to determine whether at least one battery cell among the plurality of battery cells has a temperature above the predetermined temperature when a voltage applied to the one input port of the protection IC chip connected to the second end of the high temperature detector is lowered, and turn off the FET to block the charging or the discharging of the battery module.

4. A battery module composed of a plurality of battery cells, the battery module comprising:
one positive output terminal connected to the plurality of battery cells;
a field effect transistor (FET) provided on a current path between the positive output terminal and an external device;
a protection integrated circuit (IC) chip configured to control the FET;
a plurality of thermal films, each thermal film surrounding a respective one of the battery cells; and
a high temperature detector configured to detect whether a temperature of the battery module is above a predetermined temperature,
wherein a first end of the high temperature detector is connected to the positive output terminal, wherein a second end of the high temperature detector is connected to one input port of the protection IC chip, wherein the protection IC chip is configured to detect a high temperature of at least one of the plurality of battery cells using only the one input port of the protection IC chip, wherein the high temperature detector includes a plurality of positive temperature coefficient (PTC) thermistors connected in series with each other, wherein each of the plurality of PTC thermistors includes a temperature-sensitive dielectric constant changing unit in which a dielectric constant decreases when exposed to at least a predetermined threshold temperature, and wherein the temperature-sensitive dielectric constant changing unit of each of the plurality of PTC thermistors directly contacts a respective one of the plurality of thermal films to detect a temperature of the respective one of the plurality of thermal films.

5. The battery module of claim 4, wherein the protection IC chip is configured to determine whether at least one battery cell of the plurality of battery cells has a temperature above the predetermined temperature when a voltage applied to the one input port of the protection IC chip connected to the second end of the high temperature detector is lowered, and turn off the FET to block charging or discharging of the battery module.

6. A method for detecting a high temperature in a battery module composed of a plurality of battery cells, the method comprising:
   a voltage measurement step of measuring a voltage applied to one input port of a protection integrated circuit (IC) chip;
   a high temperature determination step of determining whether any one of the plurality of battery cells has a temperature above a predetermined temperature based on the measured voltage; and
   a charging and discharging blocking step of blocking charging or discharging of the battery module, by a field effect transistor (FET) provided on a current path between the positive output terminal and an external device to block the charging or discharging of the battery module, when it is determined that the temperature of at least one battery cell among the plurality of battery cells is above the predetermined temperature in the high temperature determination step, wherein the voltage applied to the one input port of the protection IC chip varies by a plurality of positive temperature coefficient (PTC) thermistors provided in contact with each of the plurality of battery cells, the plurality of PTC thermistors are connected in series with each other, wherein the protection IC chip is configured to control the charging and discharging blocking step of the battery module by using only one output port of the protection IC chip, wherein the protection IC chip is configured to detect the high temperature of at least one of the plurality of battery cells using only the one input port of the protection IC chip, wherein the protection IC chip only includes two ports, the two ports being the one input port configured to detect the high temperature of the at least one of the plurality of battery cells and the one output port configured to control the blocking the charging and the discharging of the battery module, and wherein the protection IC chip is not directly connected to any battery cell of the plurality of battery cells.

7. The method of claim 6, wherein the high temperature determination step includes:
   determining that all battery cells have a temperature less than the predetermined temperature when the voltage applied to the one input port of the protection IC chip is less than a predetermined reference voltage; and
   determining that the temperature of at least one battery cell among the plurality of battery cells is above the predetermined temperature when the voltage applied to the one input port of the protection IC chip is greater than or equal to the predetermined reference voltage.

8. A battery pack configured to include the battery module according to claim 1.

9. An electronic device mounted with the battery module according to claim 1.

10. A battery pack configured to include the battery module according to claim 4.

11. An electronic device mounted with the battery module according to claim 4.

* * * * *